(12) United States Patent
Buckley

(10) Patent No.: US 10,752,190 B1
(45) Date of Patent: Aug. 25, 2020

(54) POWER WINDOW SYNC SWITCH

(71) Applicant: Richard Oswald Neville Buckley, Oshawa (CA)

(72) Inventor: Richard Oswald Neville Buckley, Oshawa (CA)

( * ) Notice: Subject to any disclaimer, the term of this patent is extended or adjusted under 35 U.S.C. 154(b) by 0 days.

(21) Appl. No.: 16/532,792

(22) Filed: Aug. 6, 2019

(51) Int. Cl.
| | | |
|---|---|---|
| *B60R 16/027* | (2006.01) | |
| *E05F 15/60* | (2015.01) | |
| *B62D 1/04* | (2006.01) | |
| *B60K 35/00* | (2006.01) | |
| *B60R 16/037* | (2006.01) | |

(52) U.S. Cl.
CPC ............ *B60R 16/027* (2013.01); *B60K 35/00* (2013.01); *B60R 16/0373* (2013.01); *B62D 1/046* (2013.01); *E05F 15/60* (2015.01); *B60K 2370/171* (2019.05); *E05Y 2900/55* (2013.01)

(58) Field of Classification Search
CPC ... B60R 16/027; B60R 16/0373; B62D 1/046; B60K 35/00; B60K 2370/171; E05F 15/60; E05Y 2900/55
USPC .......................................................... 701/49
See application file for complete search history.

(56) References Cited

U.S. PATENT DOCUMENTS

| | | | | |
|---|---|---|---|---|
| 4,528,687 A | * | 7/1985 | Noso ................... | B60R 16/0373 |
| | | | | 701/36 |
| 5,760,554 A | * | 6/1998 | Bustamante .......... | H03K 17/96 |
| | | | | 318/280 |
| 2002/0105295 A1 | * | 8/2002 | Cregeur ................ | E05F 15/689 |
| | | | | 318/283 |
| 2004/0154904 A1 | * | 8/2004 | Varga ..................... | H01H 25/04 |
| | | | | 200/5 A |
| 2010/0039248 A1 | * | 2/2010 | Mauro ..................... | B60Q 9/00 |
| | | | | 340/438 |
| 2016/0167605 A1 | * | 6/2016 | Rego ..................... | E05F 15/695 |
| | | | | 307/9.1 |

FOREIGN PATENT DOCUMENTS

| | | | | | |
|---|---|---|---|---|---|
| CN | 105625857 A | * | 6/2016 | | |
| CN | 106907078 A | * | 6/2017 | | |
| EP | 1111635 A2 | * | 6/2001 | ........... | H01H 3/0213 |

(Continued)

OTHER PUBLICATIONS

English Translation: Shin, Korean Patent Publication KR 101573626 B1, Dec. 2015 (Year: 2015).*

(Continued)

*Primary Examiner* — Nadeem Odeh
(74) *Attorney, Agent, or Firm* — Nasser Ashgriz; UIPatent Inc.

(57) ABSTRACT

The present invention is a power window sync switch for the windows of a vehicle that permits controlling all windows by a single active home or main control window switch. It permits the driver to move all window panels in the vehicle to the same position at the same time. The power window sync switch sends a signal to a micro-processor within the switch to indicate that the window position selected via the actuated switch is to be applied to all window panels simultaneously. The micro-processor within the switch may then proceed to actuate all window lift motors within the vehicle, causing movement of all window panels to the appropriate positions.

12 Claims, 13 Drawing Sheets

(56) References Cited

FOREIGN PATENT DOCUMENTS

JP 11096853 A * 4/1999
KR 101573626 B1 * 12/2015

OTHER PUBLICATIONS

English Translation: Sato, Japanese Patent Publication JP H11-96853 A, Apr. 1999 (Year: 1999).*
English Translation: Wu, Chinese Patent Publication CN 1069707078 A, Jun. 2017 (Year: 2017).*
English Translation: Yang, Chinese Patent Publication CN 105625857 A, Jun. 2016 (Year: 2016).*

* cited by examiner

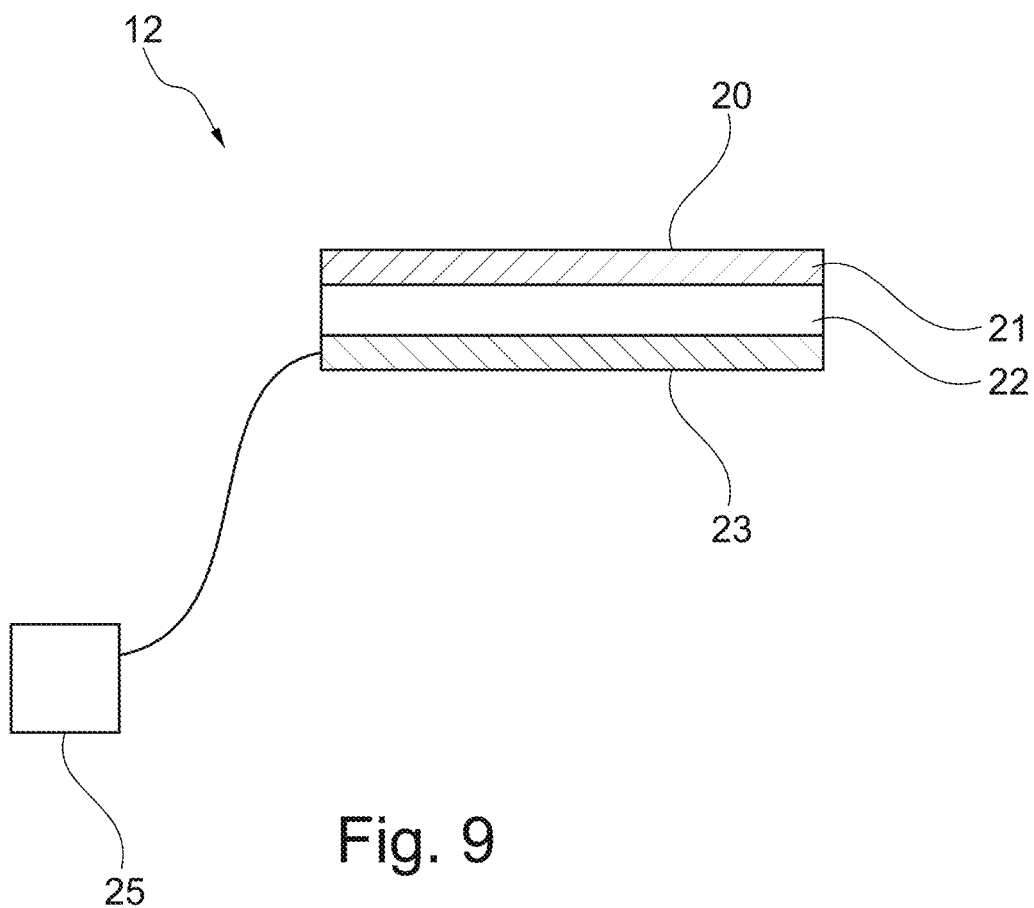

POWER WINDOW SYNC SWITCH

FIELD OF THE INVENTION

The present invention relates in general to the automotive industry, and especially to the power window functionality.

BACKGROUND OF THE INVENTION

Drivers of modern cars have a number of functions to think of, and at the same time an increasingly complex pattern of traffic to follow. The modern cars have become a high-technology unit equipped with advanced devices related to comfort and safety for example, mobile telephones, the Internet, e-mail, TV/video, navigation, the display of maps etc. These technologies may conflict at the same time the consideration of road safety. Authorities all over the world are becoming increasingly concerned about road safety and especially how they can provide more safer ways to profit these technologies.

Automobiles have many electrically actuated devices to lower or raise a power window. A driver or a passenger must actuate the power window switch and continue to hold the switch in the actuated position until the window has reached the desired position. Some switches provide automatic mode to enable the driver to move the switch to a position which continues to actuate the window motor until the glass panel reaches its fully lowered or fully raised position, or to a position other than the fully lowered or fully raised position with a single, momentary contact.

Power window controls for motor vehicles enable the operator to initiate window movement. One drawback of these systems is that the driver's attention to the road may be compromised due to the checking of windows (e.g., rear windows) for desired height adjustment while operating the vehicle. The other drawback of these systems is that, in the case of vehicles with front and rear windows, sometimes the rear windows may be left down. This can be due to the assumption that the rear windows are in closed position or the operator or user simply forgets to check the rear windows after they have closed the windows within their immediate line of sight.

Various system and devices have been disclosed to power window switch. Available devices such as "key fob" control all vehicle windows but may only be operated with the key fob and functions before the driver enters the vehicle. This feature may only be operated from outside the vehicle, therefore is not practical to use.

Power window switches are further available and control the individual function of the vehicles corresponding windows. In order to operate more than one window with power window switch the user must use two or more fingers to imitate the functionality. Therefore, there is a need for a system to adjust more than one window with a single switch.

SUMMARY OF THE INVENTION

The present invention is a power window sync switch which permits controlling all windows within a vehicle via a single active home or main control window switch. It permits the driver to move all window panels in the vehicle to the same position at the same time. This arrangement provides multifunctions to power window switches. The power window sync switch may include means, which sends a signal to a micro-processor within the switch. The signal may indicate that the window position selected via the actuated switch is to be applied to all window panels simultaneously. The micro-processor within the switch may then proceed to actuate all window lift motors within the vehicle, causing movement of all window panels to the appropriate positions. Currently available switch technology may be utilized to construct this embodiment of the present invention in a variety of ways.

The present invention permits controlling front windows within a vehicle via a single control window switch and the rear windows with another single control window switch permitting the driver to move front window panels in the vehicle to the same position at the same time and the rear window panels at the same time. The main switch may include means which sends a signal to the micro-processor within the switch indicating that the window position selected via the actuated touch position is to be applied to front window panels or rear window panels simultaneously.

The switch allows the driver/operator to pay less attention to the windows while operating the vehicle and more attention spent focusing on the road even if it is just a split second that's gained. The "power window sync switch" is more than likely to be located in direct proximity to the power window switches for easy operation in an area that is familiar to the driver/operator. With the use of a mechanical or even touch switch this device can be set to suit the driver's needs. Before exiting the vehicle, the driver/operator can simply close all windows simultaneously with the use of a single switch. The "Power Window Sync Switch" is practical for all vehicles with power windows including cars, trucks, vans, luxury vehicles, mid class vehicles, or basic vehicles.

The present invention is a system to operate the "power window sync switch" function while operating the vehicle with less attention paid to the individual window heights and switches. The vehicle operator or user of the switch simply selects the desired window operation setting which then gives the operator or user the ability to control all windows by using the driver's window switch only, as a home button. It will control all of the vehicles windows and allows the driver or user to control either the front windows or rear widows using the drivers' window switch to control the front windows and the driver's side rear window switch to control the rear windows.

Therefore, it is an object of the present invention to provide ability to operate the "power window sync switch" function while operating the vehicle with less attention paid to the individual window heights and switches.

It is another object of the present invention to provide a safer system for the drivers to focus on the road than on the window adjustment.

It is another object of the present invention to provide a system for rolling up or closing the windows before exiting the vehicle being undisputable about the rear windows left down.

It is another object of the present invention to improve the general door panel area that contains the power window switch, power lock, window lock etc. and would add additional convenience to the operator or user. The advantage over existing technologies would be the added convenience as far window functionality to the operator or user to go with more of the driver's attention spent on the road.

It is another object of the present invention for quick and simple operation whether the operator or user is lowering (opening) or raising (closing) the windows while operating the vehicle or getting ready to exit the vehicle they can have a piece of mind using this window function knowing that the windows are opening or closing together when using the "Power Window Sync Switch" is in operation.

BRIEF DESCRIPTION OF THE DRAWINGS

Embodiments herein will hereinafter be described in conjunction with the appended drawings provided to illustrate and not to limit the scope of the claims, wherein like designations denote like elements, and in which:

FIG. 9 is a cross-sectional view of an embodiment switch;

DETAILED DESCRIPTION OF PREFERRED EMBODIMENTS

Figure 1:
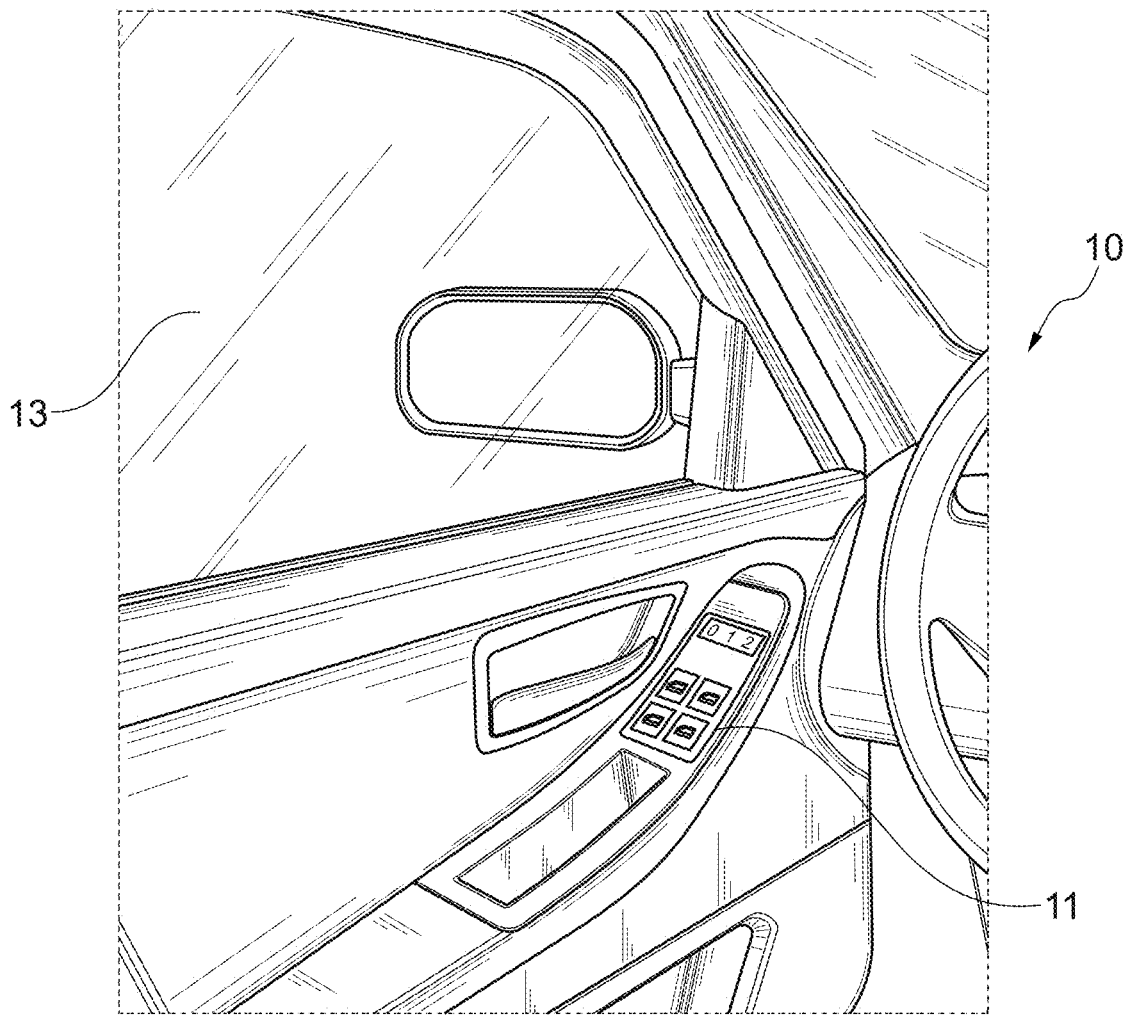
FIG. 1 is a perspective view of the interior of a vehicle's driver door, switch and window.

FIG. 1 shows a power window sync switch system 10 for opening and closing an automobile window. The system includes a plurality of switches installed on a panel 11 to move a window 13 to open and close position by a movement mechanism. In one embodiment, an elongated continuous input pad is provided with a plurality of switches, each switch being associated with a corresponding window. The switch panel 11 having a plurality of touch positions to control the movement of the corresponding window 13 of a vehicle. The switch panel 11 with a plurality of input pads may be positioned on a driver's door armrest or on the console near the drive shifter and/or cup holders which permit the driver to control the condition of all windows within the vehicle.

Figure 2:
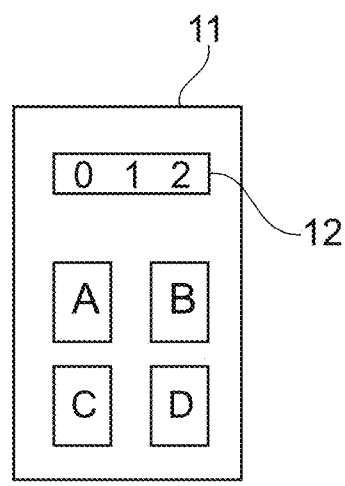
FIG. 2 is a top view of an alternative embodiment of the switch panel and the switch positions.

According to FIG. 2, the switch panel 11 of the present invention provides a power window sync switch 12 and four power window switches A, B, C and D, each indicating a particular touch position and corresponding window condition. Switch A actuates the driver's window, switch B actuates front passenger window, switch C actuates rear driver's side window and D actuates the rear passenger side window. The movement of the windows are achieved by mechanism well known in the art.

Each switch has a plurality of touch positions in electrical communication with the movement mechanism. Upon actuation of one of the touch positions, the window is moved to a particular position corresponding to the touch position. The touch positions are preferably arranged on a switch convenient to the user and corresponding to each window.

Figures 3A, 3B, 3C:
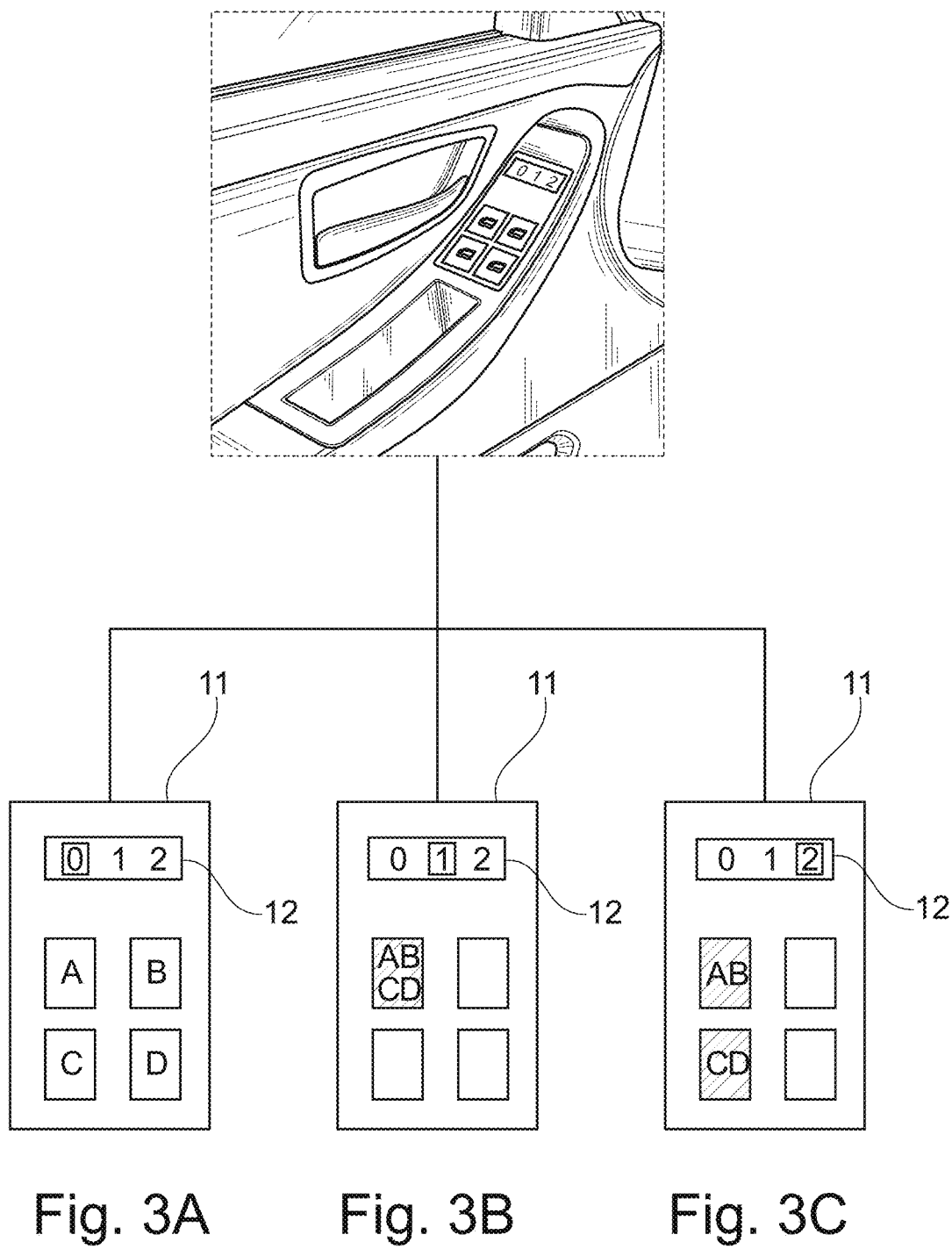
FIG. 3A is a top view of switch panel illustrating a first functionality of the present invention.
FIG. 3B is a top view of switch panel illustrating a second functionality of the present invention.
FIG. 3C is a top view of switch panel illustrating a third functionality of the present invention.

The power window sync switch comes in a variety of shapes and configurations. Power window sync switches with three touch switches as illustrated in FIGS. 3A to 4C or power window sync switches with two switches as illustrated in FIGS. 5A to 8B. As shown in FIG. 3A, power window sync switch 12 comprises of three touch positions: 0, 1, 2. When the 0 switch is active the power sync switch is in off condition. This functions all four power window switches, the driver's window switch A, front passenger window switch B, rear driver's side window switch C and rear passenger side window switch D function as normal. Referring to FIG. 3B when switch 1 is active, the power window sync switch is in on condition. This operates all four power window switches: the driver's window switch A, front passenger window switch B, rear driver's side window switch C and rear passenger side window switch D. They function all at a time, when function (1) is selected, the switch labelled (ABCD) is in control of the corresponding power windows. It is to be understood that this function may be reduced to (AB) if the vehicle only equipped with two power windows (e.g. coupe or truck) as shown in FIGS. 7A to 8B.

Referring to FIG. 3C when switch 2 is active, the power window sync switch is in on condition. This operates all two front power window switches, the driver's window switch A and front passenger window switch B function at a time and the driver's side window switch C and rear passenger side window switch D function at a time. Therefore, when function (2) is selected, the switches labelled (AB) and (CD) are in control of the corresponding windows.

Figures 4A, 4B, 4C:
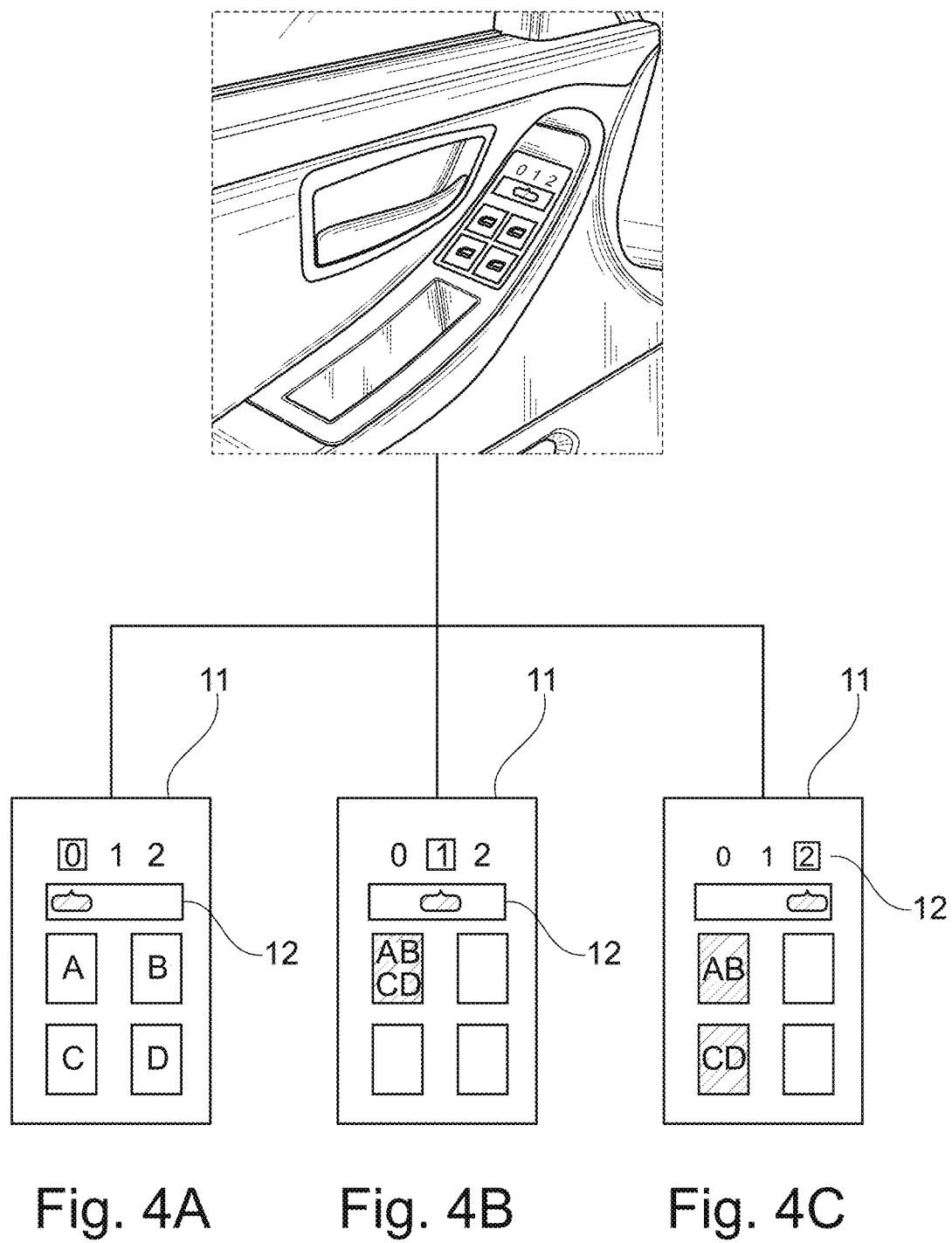
FIG. 4A is a top view of switch panel illustrating a first functionality of the present invention.
FIG. 4B is a top view of switch panel illustrating a second functionality of the present invention.
FIG. 4C is a top view of switch panel illustrating a third functionality of the present invention.

The power window switches come in a variety of shapes. FIGS. 4A, 4B and 4C show another embodiment of the present invention in which the power window sync switch is in a shape of a sliding switch to select the method of the functionality of the power window sync switch.

Figure 5A:
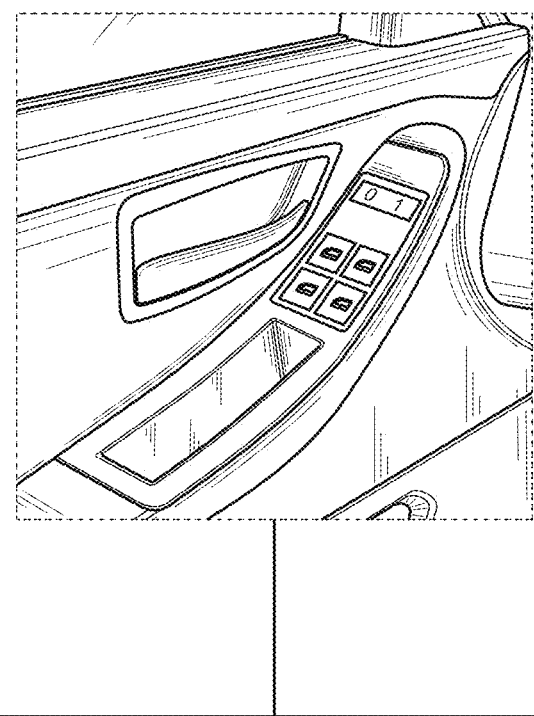
FIG. 5A is a top view of switch panel illustrating a functionality of the present invention.
Figure 5B:
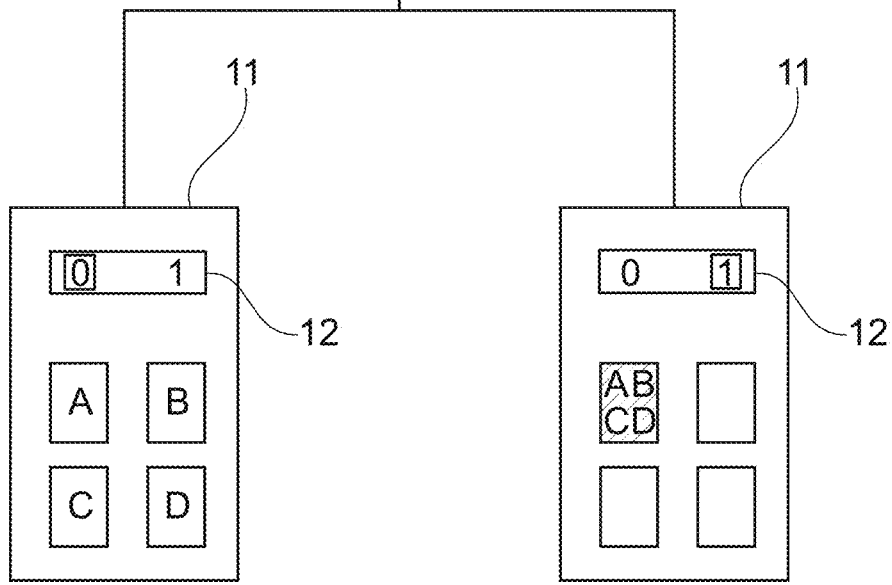
FIG. 5B is a top view of switch panel illustrating a functionality of the present invention.

FIGS. 5A and 5B depict the power window sync switch with two range functionalities. FIG. 5A power window sync switch 12 comprises of two touch positions: 0, 1. When the 0 switch is active the power sync switch is in off condition. This functions that all four power window switches, the driver's window switch A, front passenger window switch B, rear driver's side window switch C and rear passenger side window switch D function as normal. Referring to FIG. 5B when the switch (1) is active, the power window sync switch is in on condition. This functions all four power window switches: the driver's window switch A, front passenger window switch B, rear driver's side window switch C and rear passenger side window switch D function at a time. Therefore, when function (1) is selected, the switch labelled (ABCD) is in control of the corresponding power windows.

Figure 6A:
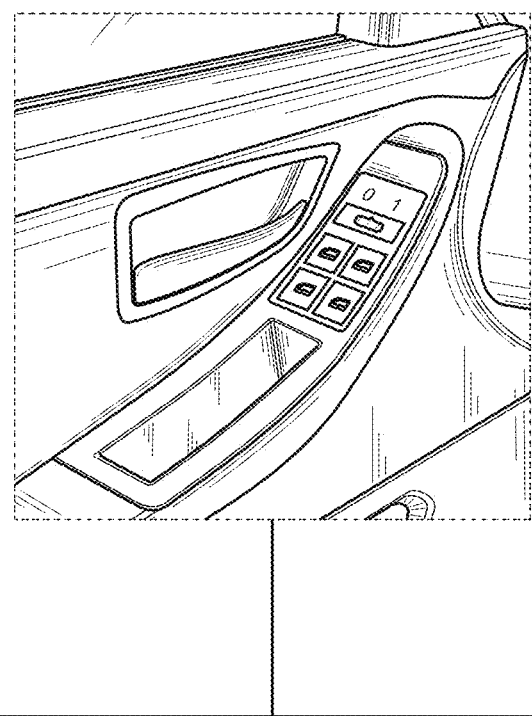
FIG. 6A is a top view of switch panel illustrating a functionality of the present invention.
Figure 6B:
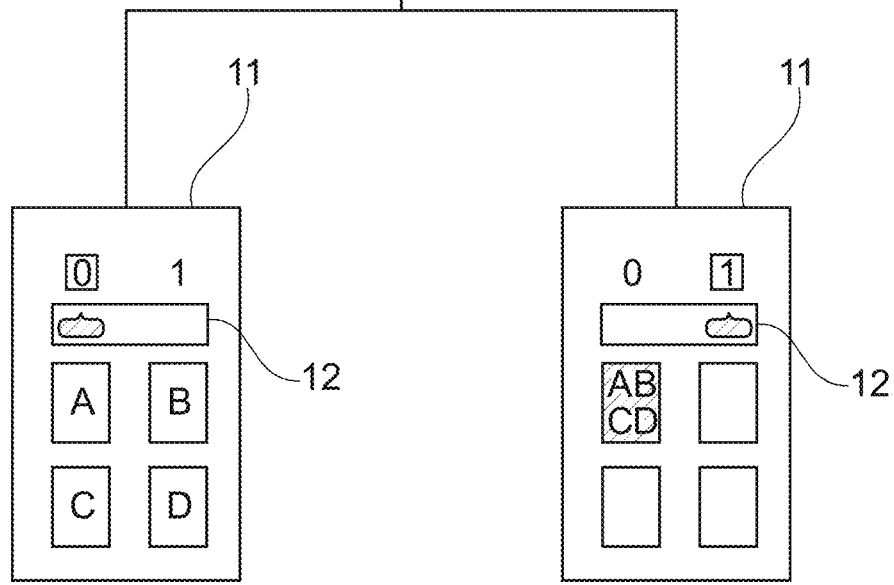
FIG. 6B is a top view of switch panel illustrating a functionality of the present invention.

FIGS. 6A and 6B show another embodiment of the power window sync switch with 2 functions and a sliding button for select each function. FIG. 6A power window sync switch 12 comprises of two touch positions: 0, 1. When the switch is on (0), the power sync switch is in off condition. In this case, all windows operate in their normal way: individually. Referring to FIG. 6B, when the sliding button is on (1), the power window sync switch is in on condition. This functions all four power window switches at one time. Therefore, the driver's window switch A, front passenger window switch B, rear driver's side window switch C and rear passenger side window switch D function at a time when switch is on (1), (ABCD) is in control of the corresponding power windows.

Figure 7A:
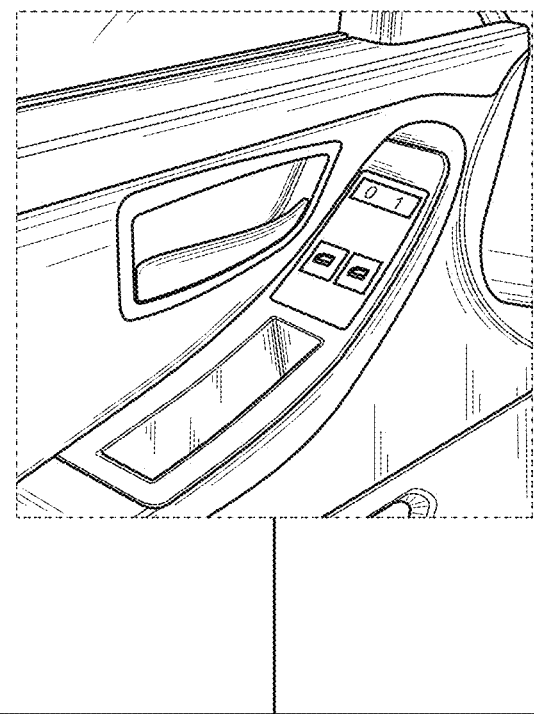
FIG. 7A is a top view of switch panel illustrating a first functionality of the present invention for vehicles with two power windows.
Figure 7B:
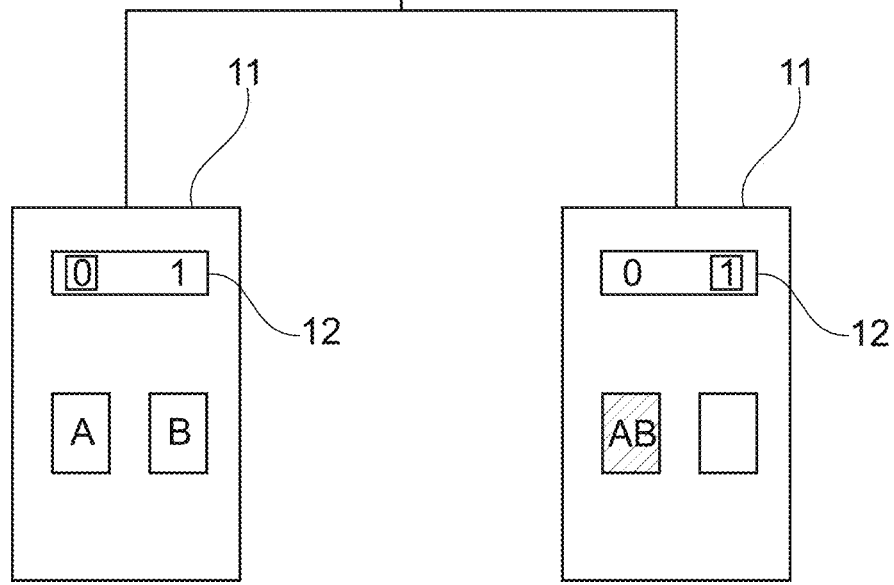
FIG. 7B is a top view of switch panel illustrating a second functionality of the present invention for vehicles with two power windows.

FIGS. 7A to 8B illustrates power window sync switch for the vehicles equipped with two power windows: e.g., coupes, trucks, etc. The power window sync switch may be reduced to (AB). As shown in FIGS. 7A and 7B the power window sync switch has two different functionalities. FIG. 7A power window sync switch 12 comprises of two touch positions: 0, 1. When the switch is on 0, the power sync switch is in off condition. This functions the power window switches, the driver's window switch A and front passenger window switch B function as normal. Referring to FIG. 7B when the switch is on 1, the power window sync switch is in on condition. This functions that the driver's window switch A and front passenger window switch B function at a time which means when the function (1) is selected the switch labelled (AB) is in control of the corresponding power windows.

Figure 8A:
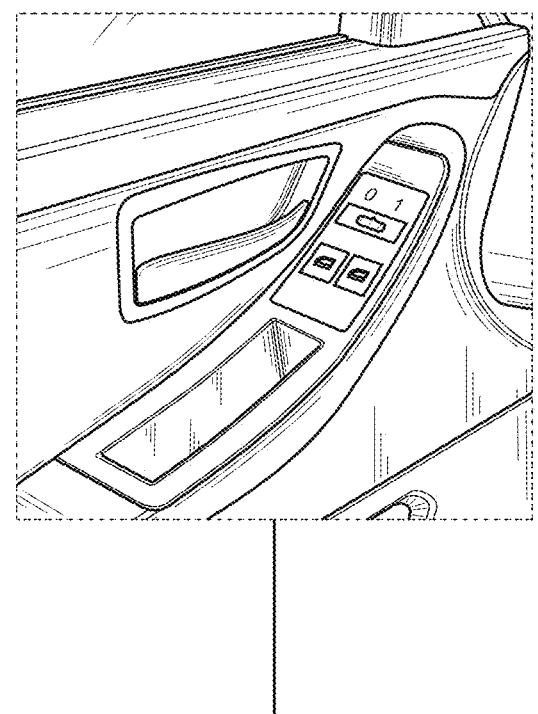
FIG. 8A is a top view of switch panel illustrating a first functionality of the present invention for vehicles with two power windows.
Figure 8B:
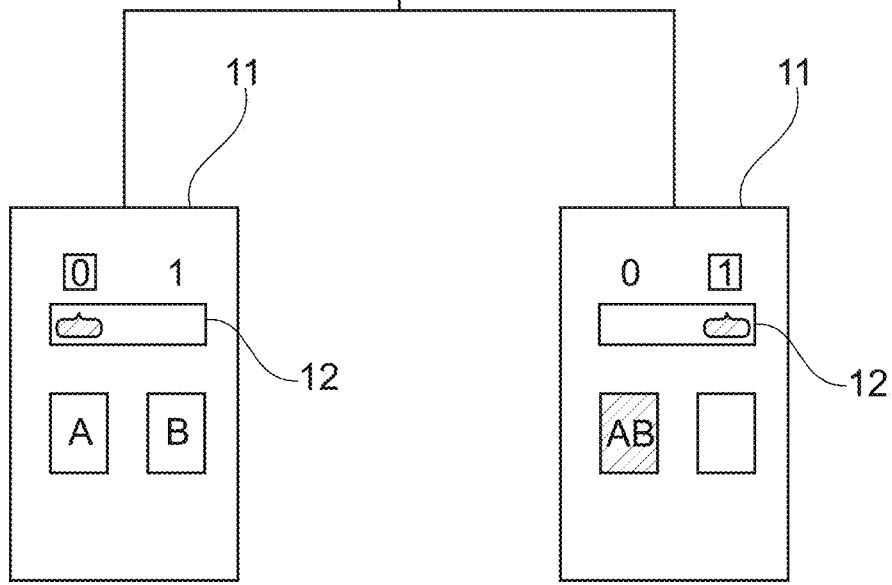
FIG. 8B is a top view of switch panel illustrating a second functionality of the present invention for vehicles with two power windows.
Figure 10:
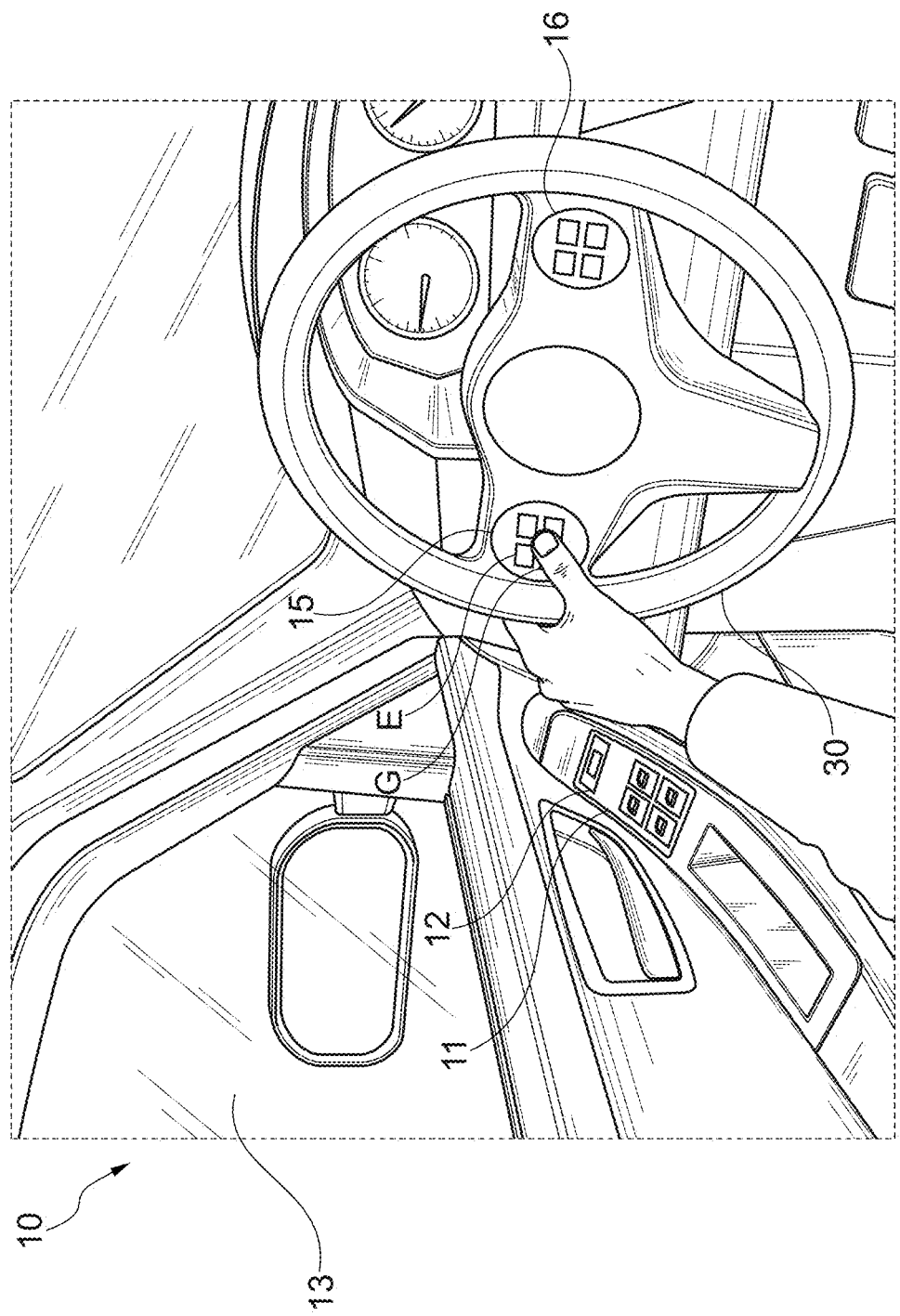
FIG. 10 is a perspective view of another embodiment of the present invention showing the power window switches mounted on a steering wheel.

FIGS. 8A and 8B show another embodiment of the power window sync switch with 2 range functionality and a sliding button to select the functionality. FIG. 8A power window sync switch 12 comprises of two positions: 0, 1. When the switch is on 0, the power sync switch is in off condition. This lets the driver's window switch A and front passenger window switch B to operate in their normal individual mode. Referring to FIG. 8B, when the sliding button is on (1), the power window sync switch is in on condition. This operates the driver's window switch A and front passenger window switch B at one time. Therefore, when setting (1) is selected, the switch labelled (AB) is in control of the corresponding power windows.

In the preferred embodiment, the power window sync switch 12 provides control system to adjust windows to the desired position. The user can lower windows to their fully opened condition or raise the windows to their fully closed condition, half-closed or three-quarters closed according to the principles of the present invention. For example, in FIG. 3B, when switch is on 1, the power window sync switch 12 is in "on" condition. This operates all four power window switches together: the driver's window switch A, front passenger window switch B, rear driver's side window switch C and rear passenger side window switch D. Therefore, when (1) is selected, the switch labelled (ABCD) is in control of the corresponding power windows.

The user can select the windows and the desired position for each window. A number of touch positions or switch depressing arrangements may be utilized wherein each touch position or depressing arrangements sends a signal to the power switch, which actuates a motor, for example, to raise windows to their fully closed condition, fully open condition, half-closed condition or three-quarter open-closed condition. Depending on the function selected, the driver/operator can control the windows adjustment by depressing times of the window switches. For example:

By depressing the selected window switch 1 time, the corresponding window will be lowered to ¾ Height.

By depressing the selected window switch 2 times, the corresponding windows will be lowered to ½ Height.

By depressing the selected window switch 3 times, the corresponding windows will be lowered to ¼ Height.

By depressing the selected window switch 4 times, the corresponding windows will be lowered to fully open position.

By depressing the selected window switch 5 times, the corresponding windows will be lowered to fully closed position.

All information related to the operation of the switches can also be shown on a display panel 40 on the vehicle's dashboard 60.

A variety of configurations known to those skilled in the art may be utilized for sending an electrical signal to a switch. FIG. 9 illustrates the mechanism of the power window sync switch 12. It is to be understood that any other mechanism well known in the art to activate the switch may be provided. Each switch 12 comprises an input surface 20, which is connected to an electrical power element 25. The power element 25 is electrically connected to a motor and power source. The input surface 20 may be activated by any known method being a push, pull or may have touch positions along surface 20 to permit a user to conveniently control the movement of the windows.

The power window sync switch 12 comprises, a flexible conductive membrane 21, an air gap 22 and a resistor 23. Membrane 21 is electrically connected to power source. When the user depresses the switch or a touch position on input surface 20, flexible membrane 21 is depressed, causing to traverse air gap 22 and contact resistive layer 23, thereby completing a circuit and sending a resultant signal to power element 25. Each switch or touch position of input surface 20 will generate a unique resultant signal. Other known switch technologies may also be provided in the system.

Power element 25 preferably includes a micro-processor within which is stored a set of outgoing signals which correspond to the possible range of resultant signals which input surface 20 may generate. Power element 25 receives the resultant signal, determines which outgoing signal corresponds to the resultant signal, and sends the outgoing signal to window lift motor, which is actuated by the outgoing signal from the switch. Motor then raises or lowers window to the position which corresponds to the touch position contacted by the user.

In the preferred embodiment, motor also includes a micro-controller which senses the position of window and upon receipt of the outgoing signal from power element 25, compares the position of windows with the desired position and moves windows to adjust to the desired position.

In another embodiment of the present invention, which is depicted in FIGS. 10A to 13 the window switches 15 and 16 are arranged on the steering wheel 30 of a vehicle to control window functions, which allows the driver to control all the relevant functions and commands without taking his hands off the steering wheel 30 or moving his eyes from the road. The switches are implemented in a steering wheel together with other switches and in such a way to operate various functions during driving. The switches 15 and 16 can interact with the power window sync switch 12 of the system to operate or control vehicles windows. The driver/operator of the vehicle will at all times be able to operate the functions with left-hand function switches 15 and right-hand function switches 16. The operational system involves both mechanical and electronic solutions and means for signal transmission in this connection. The switches E and G operate the functions step by step.

The switches 15 and 16 are arranged in an ergonomic order within a natural distance for steering wheel grip 30 so that the commands can be carried out by the driver/operator by use of the thumb without any need to vision and to enhance safety.

The power window sync switch 12 controls the function of the power window switches 15 and 16 each corresponding to a window condition. Upon actuation of one of the touch positions, the window is moved to a particular position corresponding to the touch position.

Figure 11A:
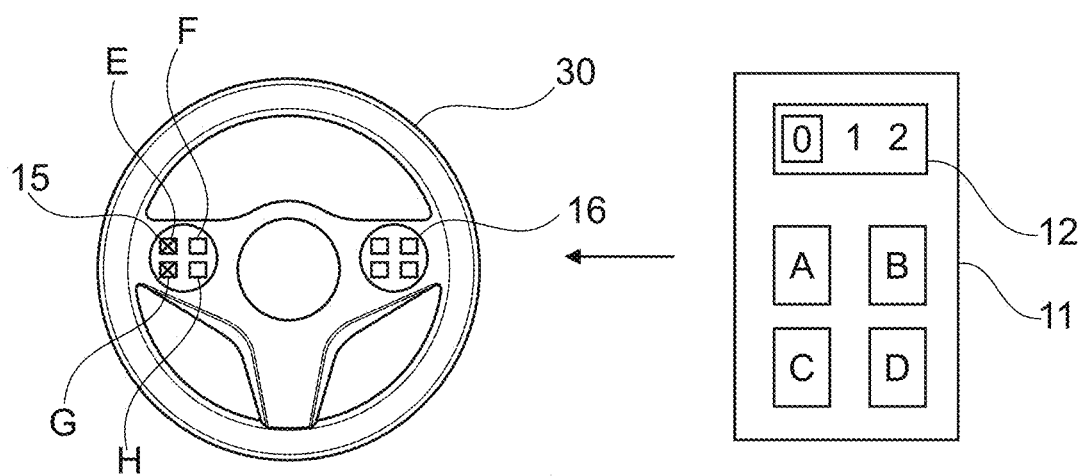
FIG. 11A illustrates a functionality of the power window switches on the steering wheel in conjunction with power window sync switch.
Figure 11B:
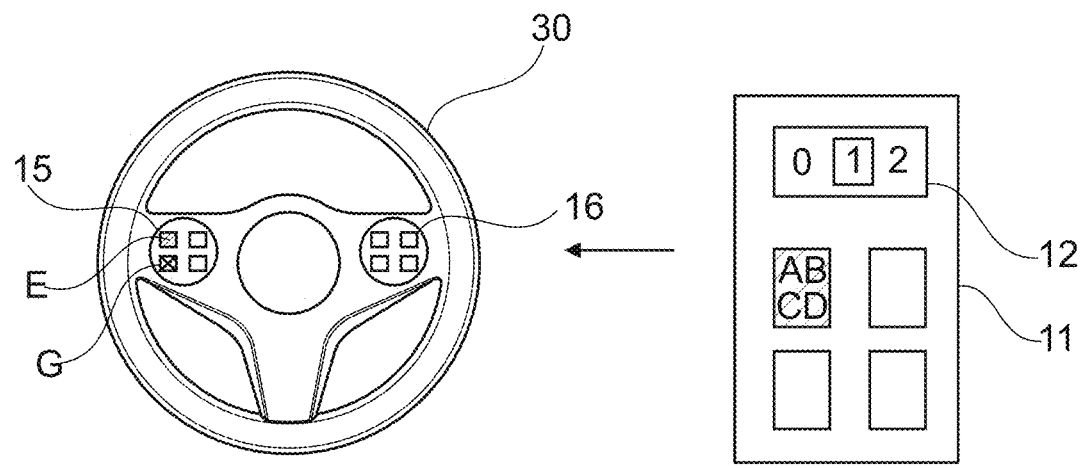
FIG. 11B illustrates a functionality of the power window switches on the steering wheel in conjunction with power window sync switch.

As shown in FIG. 11A when the power window sync switch 12 is on (0), the power window sync switch is in inactive condition. This allows all four power window switches to operate in their normal mode. Referring to FIG. 11B, when the switch is on 1, the power sync switch 12 is on, the power window sync switch 12 is in active condition. This allows that all four power window switches to operate together.

Figure 11C:
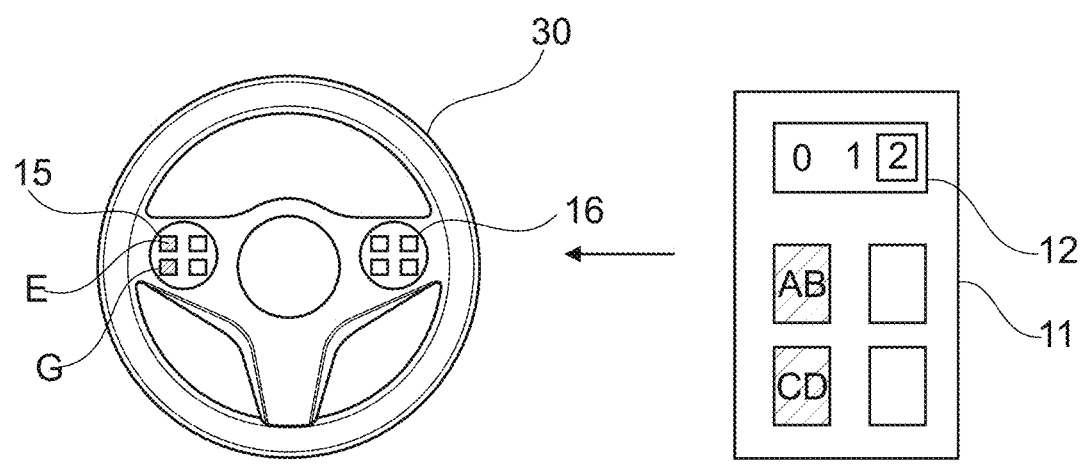
FIG. 11C illustrates a functionality of the power window switches on the steering wheel in conjunction with power window sync switch.

Referring to FIG. 11C when the switch is on 2, the power window sync switch 12 is in multiple action condition. This allows all two front power window switches to operate together. Therefore, when the switch on 2, the system is in multi-action mode.

Figure 12A:
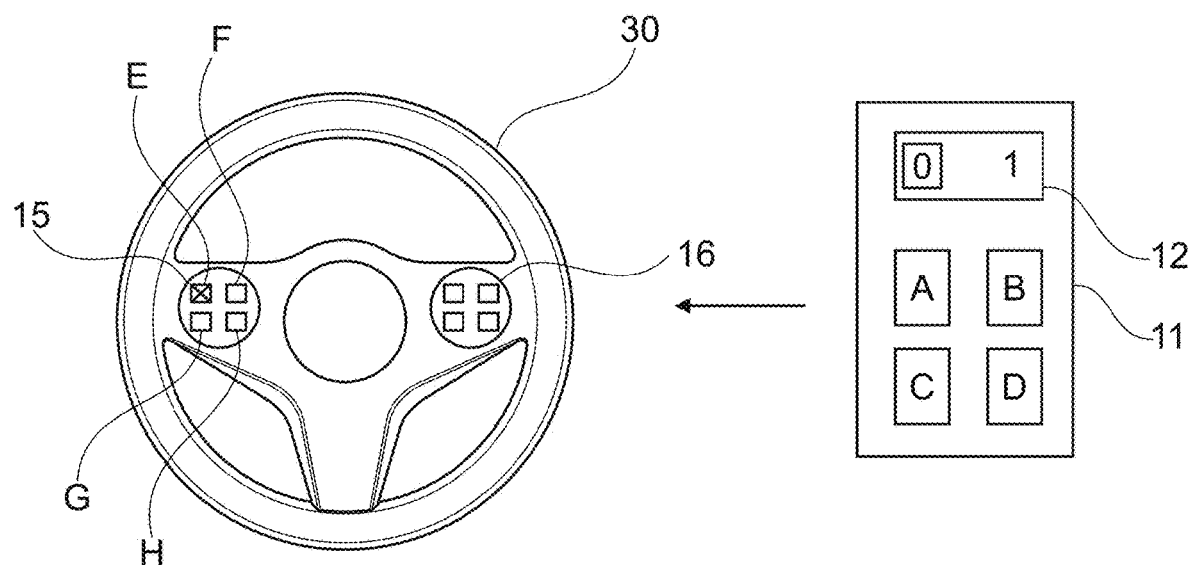
FIG. 12A illustrates a functionality of the power window switches on the steering wheel in conjunction with power window sync switch.
Figure 12B:
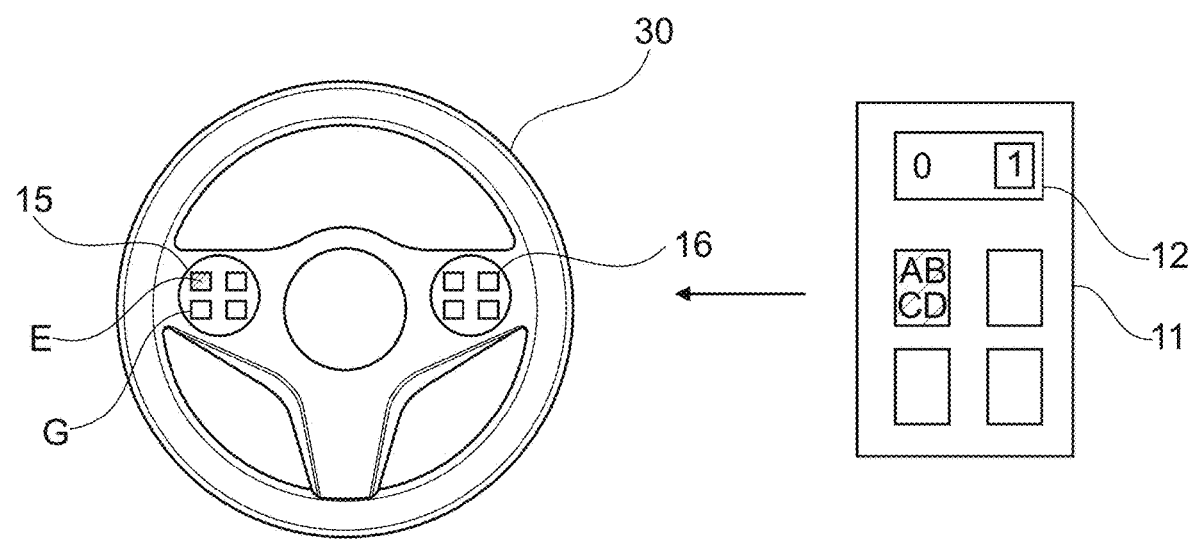
FIG. 12B illustrates a functionality of the power window switches on the steering wheel in conjunction with power window sync switch.

FIGS. 12A and 12B depict the power window sync switch 12 with two different functionalities. In FIG. 12A, the power window sync switch 12 comprises of two touch positions: 0, 1. When on (0), the power sync switch is in inactive condition. This allows all four power window switches to operate in a normal individual mode. Referring to FIG. 12B when the switch in on (1), the power window sync switch 12 is in active condition. This allows that all four power window switches to operate together.

Figure 13A:
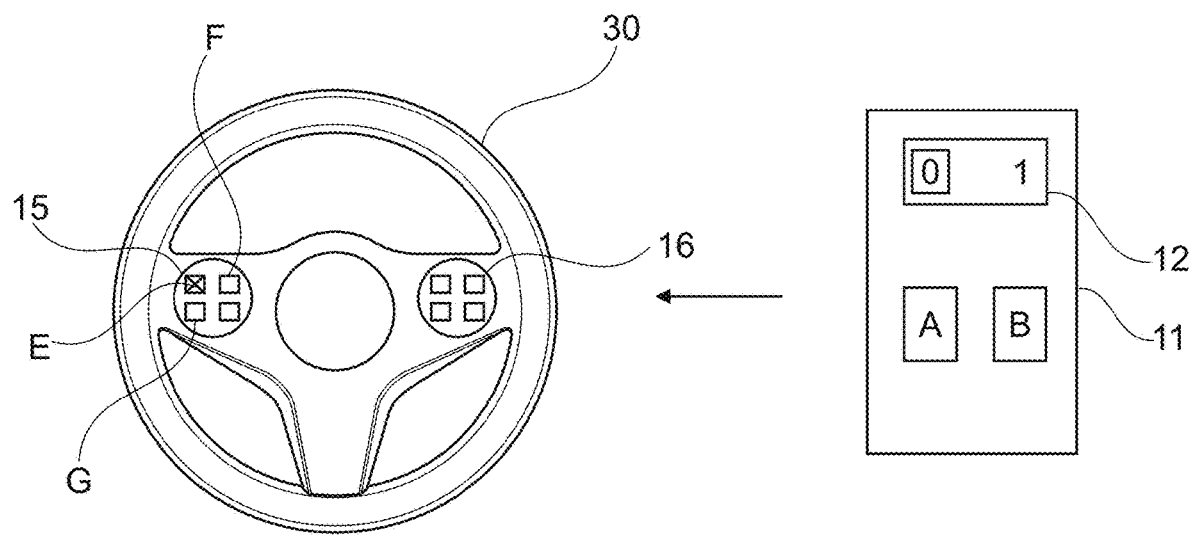
FIG. 13A illustrates a functionality of the power window switches on the steering wheel in conjunction with power window sync switch.
Figure 13B:
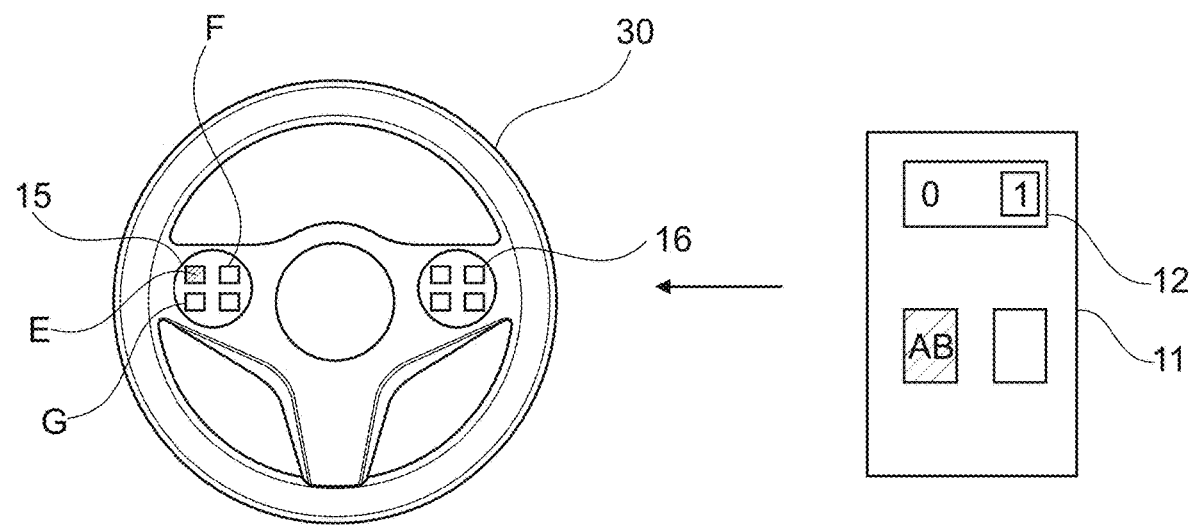
FIG. 13B illustrates a functionality of the power window switches on the steering wheel in conjunction with power window sync switch.

FIGS. 13A to 13B illustrates power window sync switch 12 for the vehicles equipped with two windows: e.g., coupe, truck, etc. The power window sync switch 12 comprises of two touch positions: (0) and (1). When the (0) switch is active the power sync switch 12 is in inactive condition. This functions that power window switches, the driver's window switch E and front passenger window switch F function as normal. Referring to FIG. 13B when the (1) switch is active, the power window sync switch is in active condition. This functions that the driver's window switch E and front passenger window switch F function at a time.

Figure 14:
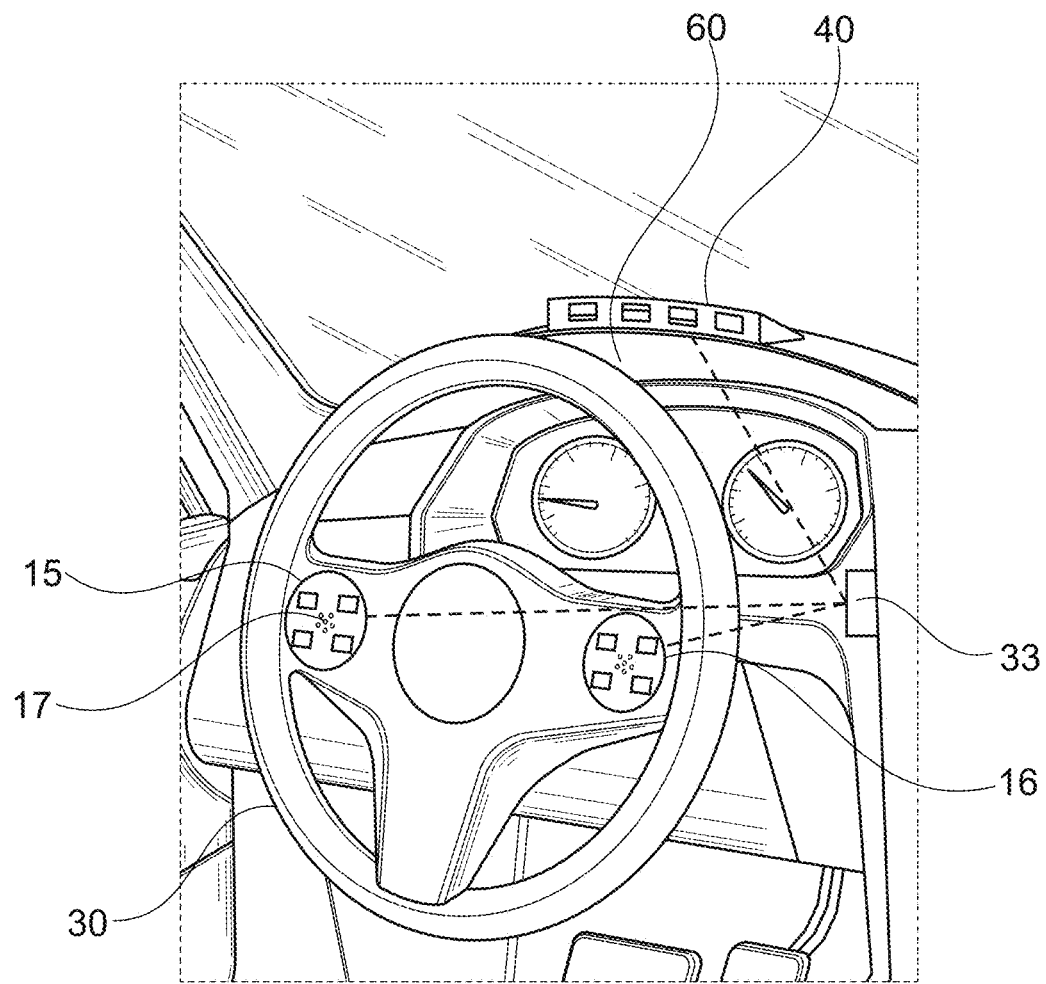
FIG. 14 illustrates the arrangement of the features of the invention and mode of operation of the arrangements.

According to FIG. 14 the power window switches 15 and 16 further provide a functionality to control the adjustment of the windows to desired position. Depending on the function selected, the driver/operator can control the windows adjustment by tapping times of the switches 15 and 16. The user can lower windows to their fully opened condition or raise the windows to their fully closed condition, half-closed or three-quarters closed according to the principles of the present invention. The user can select the windows and the desired position for each window. All information related to the operation of the switches can also be shown on a display panel 40 on the vehicle's dashboard 60.

The window control system can be arranged in sequence as follow:
- By tapping the steering wheel control buttons 1 time the selected windows will be lowered to ¾ Height. (1)
- By tapping the steering wheel control buttons 2 times the selected windows will be lowered to ½ Height. (2)
- By tapping the steering wheel control buttons 3 times the selected windows will be lowered to ¼ Height. (3)
- By tapping the steering wheel control buttons 4 times the selected windows will be lowered to fully open position. (4)
- By tapping the steering wheel control buttons 5 times the selected windows will be lowered to fully closed position. (5)

The given commands can be displayed on the screen 40 in the driver's field of vision in the form of LED colored lighting lines to show the level of the window. This can be done optoelectronically by a number of light emitting diodes and sensors, which after decoding can provide information regarding the windows level. In this case, the driver/operator can see the position of the selected window without moving eyes from the road or turning back. All functions related to the position of the window can further be presented in a shape of colored line on the display. All movements related to the window can be followed on the display so that the driver does not need to watch the physical movement of the window by turning back and looking at the windows.

As shown in FIG. 15, again switches 15 and 16 can, for example, transmit data via the steering wheel 30, through connections to a microprocessor 33 that is adapted to process and distribute data to various operations of the windows. The processor 33 also communicates with the display 40. Transmission of switch data may be carried out through the microprocessor 33 for converting switch signals to activate various functions. Transmission of signals to the processor 33 can take place, for example, by using "Bluetooth" technology, optically or in another manner.

The function of the power window switches 15 and 16 can also be assisted by sound or voice command. The present invention can use the concept of voice command to operate the system. The voice command can be used in conjunction with the tap feature of switches 15 and 16 on the steering wheel 30 for example:

" . . . lower window to ¼ height" for which the window lowers to ¼ height. If a voice command is given and the driver/operator manually taps the steering wheel window control, the operation will proceed in sequence:

" . . . (3) or ¼, tap (4) or fully open . . . "

tap . . . next in sequence would be (4)

The voice command will be achieved through voice recognition algorithm and algorithms for the voice command of the drivers/operators. The driver/operator will command through microphones 17, which can be installed in various areas on the steering wheel. Voice recognition of the system uses a technique well known in the art to recognize drivers/operators voice, which follows a predefined structure. A voice recognition software is used to remember the users voice. The voice recognition system is totally based on artificial intelligence and robotics. There is no set order of operation for voice command: fully open-(2)-(4)-(1)-fully closed. The present invention provides a feature to set up a customized setting based on each drivers/operators preferences.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

What is claimed is:

1. A power window switch system to operate windows of a vehicle, comprising:
   a plurality of window switches to be operated by a driver or an operator to control an operation of a set of selected windows, of the windows of the vehicle, between open and close positions, and wherein said plurality of window switches are depressible control switches or tap switches;
   a multifunction synchronization switch that is in communication with said plurality of window switches, has a plurality of step positions and is equipped with a stepwise movement mechanism, wherein each step position, of the plurality of step positions, actuates a set of switch functions for said set of selected windows, said set of switch functions being a controlled operation of two or all of said set of selected windows at a time, between a fully opened and a fully closed positions, said set of selected windows are operated based on an activation pattern of at least one of said plurality of window switches, wherein said activation pattern is a number of actuations of said at least one of said plurality of window switches, said number of actuations comprising:
   actuating 1 time for ¾ window height;
   actuating 2 times for ½ window height;
   actuating 3 times for ¼ window height;
   actuating 4 times for fully open window; and
   actuating 5 times for fully closed window;
   a window movement mechanism to move said set of selected windows; and
   a switch control system having a processor to communicate the operations provided by the multifunction synchronization switch to the window movement mechanism.

2. The power window switch system of claim 1, wherein the multifunction synchronization switch is located in direct proximity to said plurality of window switches.

3. The power window switch system of claim 1, wherein said processor of said switch control system is designed to operate said set of selected windows based on said activation pattern by said driver or said operator,
   whereby the activation pattern adjusts said set of selected windows to a window height, wherein said window height corresponding to a fully closed window position, a fully open window position, a half-closed window position, a three-quarter open window position, or a three-quarter closed window position.

4. The power window switch system of claim 1, wherein said plurality of window switches are arranged on a door panel of said driver or said operator.

5. The power window switch system of claim 1, wherein said plurality of window switches are arranged on a steering wheel.

6. The power window switch system of claim 5, wherein said plurality of window switches are arranged on opposite sides of said steering wheel relative to its center and are in communication with said multifunction synchronization switch.

7. The power window switch system of claim 1, wherein said plurality of window switches are arranged on a door panel of said driver or said operator and on a steering wheel.

8. The power window switch system of claim 1, wherein said multifunction synchronization switch is a depressible control switch or a sliding switch.

9. The power window switch system of claim 1, further having a display screen to be located in a viewing zone of said driver or said operator to display the window height of said set of selected windows.

10. The power window switch system of claim 9, wherein said display screen comprising of a set of light-emitting diode (LED) lighting lines to indicate the window height.

11. The power window switch system of claim 9, wherein each of the plurality of window switches having an light-emitting diode (LED) colored lighting lines to indicate the window height of said set of selected windows.

12. The power window switch system of claim 1, wherein said window movement mechanism being a lift motor in electrical communication with a power source.

* * * * *